(12) United States Patent
Sugahara et al.

(10) Patent No.: US 6,876,560 B2
(45) Date of Patent: Apr. 5, 2005

(54) CONTENT ADDRESSABLE MEMORY AND MEMORY SYSTEM

(75) Inventors: Takeshi Sugahara, Kanagawa (JP); Yukihiro Fujimoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/452,288

(22) Filed: Jun. 3, 2003

(65) Prior Publication Data

US 2004/0190319 A1 Sep. 30, 2004

(30) Foreign Application Priority Data

Mar. 27, 2003 (JP) ........................................ 2003-088379

(51) Int. Cl.$^7$ .............................................. G11C 15/00
(52) U.S. Cl. ..................................... 365/49; 365/189.07
(58) Field of Search ............................. 365/49, 189.07

(56) References Cited

U.S. PATENT DOCUMENTS 6,137,707 A    10/2000 Srinivasan et al. ........... 365/49
6,496,398 B2 * 12/2002 Hellner et al. ................. 365/49

* cited by examiner

Primary Examiner—M. Tran
(74) Attorney, Agent, or Firm—Oblon, Spivak, McClelland, Maier & Neustadt, P.C.

(57) ABSTRACT

A content addressable memory which detects whether p (where p is an integer of 2 or more) bit sequences coincide respectively with reference bit sequences, said content addressable memory comprising: q comparison units which compares bit groups obtained by dividing the p bit sequences into q (where q is an integer of 2 or more) parts with corresponding bit groups in the reference bit sequences in p times; a precharge unit which precharges output lines of said q comparison units; and a comparison control unit responsive to a decision of noncoincidence in at least one of said q comparison units while said q comparison units are conducting an $r_{th}$ (where r is an integer variable that is 1 or more and that is at most p−1, and p is an integer of 2 or more) comparison operation, which stops precharging to be performed by said precharge unit at time of an $(r+1)_{th}$ comparison operation and subsequent comparison operations.

20 Claims, 6 Drawing Sheets

CONTENT ADDRESSABLE MEMORY AND MEMORY SYSTEM

CROSS REFERENCE TO RELATED APPLICATIONS

This application claims benefit of priority under 35USC §119 to Japanese Patent Application No. 2003-88379, filed on Mar. 27, 2003, the entire contents of which are incorporated by reference herein.

BACKGROUND OF THE INVENTION

1. Field of the Invention

The present invention relates to a content addressable memory (CAM) to be used to convert a virtual address to a physical address in a microprocessor.

2. Related Art

In microprocessors, a content addressable memory is typically used to convert a virtual address to a physical address (see Japanese Patent Application Laid-Open Publication Nos. 2000-235787 and 2002-163891).

Figure 8:
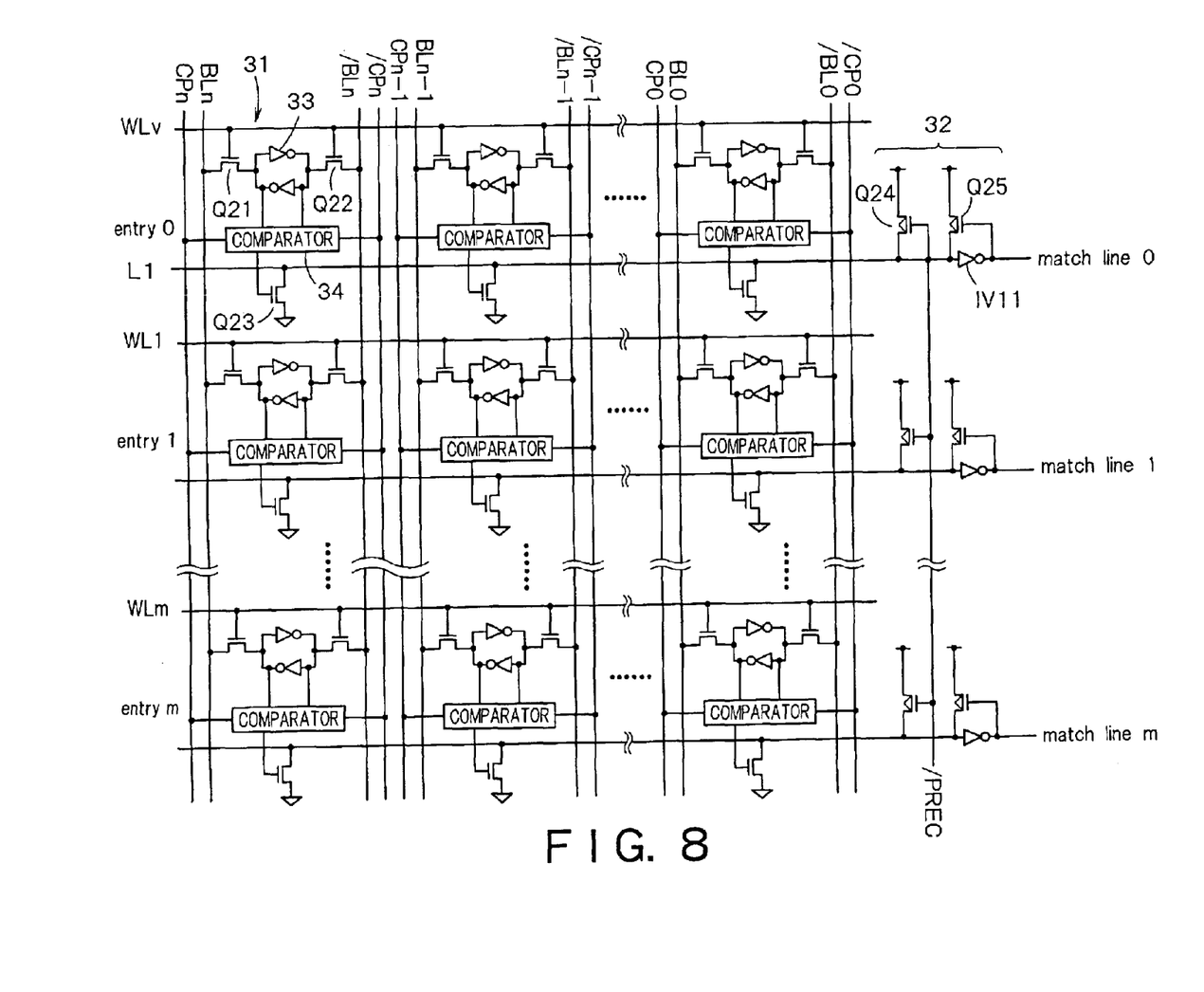
FIG. 8 is a circuit diagram showing an internal configuration of a conventional content addressable memory.

FIG. 8 is a circuit diagram showing an internal configuration of a conventional content addressable memory (CAM). The content addressable memory includes as many comparison circuits 31 as the number of bits provided for each of a plurality of entries, and precharge circuits 32 each connected to an output line L1 for comparison circuits 31 of the same entry. Each comparison circuit 31 includes an SRAM cell 33 which stores a reference bit sequence, transistors Q21 and Q22 which controls reading/writing data from/into the SRAM cell 33, a comparator 34 which compares data stored in the SRAM cell 33 with comparison data inputted from the outside, and a transistor Q23, which is turned on and off according to an output of the comparator 34.

The precharge circuit 32 is a so-called wired-NOR including a transistor Q24 which precharges the output line L1 to a high level, a transistor Q25 and an inverter IV 11 which holds a logic of the output line L1.

The output line L1 is precharged to the high level by the precharge circuit 32. If noncoincidence is detected in any one of the comparison circuits 31, then the output line L1 becomes a low level.

The content addressable memory shown in FIG. 8 includes as many such wired-NORs as the number of entries. When comparison circuits 31 conduct comparison operation, all wired-NORs operate because of the characteristics, and noncoincidence occurs in almost all wired-NORs, resulting in a problem of very large current consumption.

Figure 9:
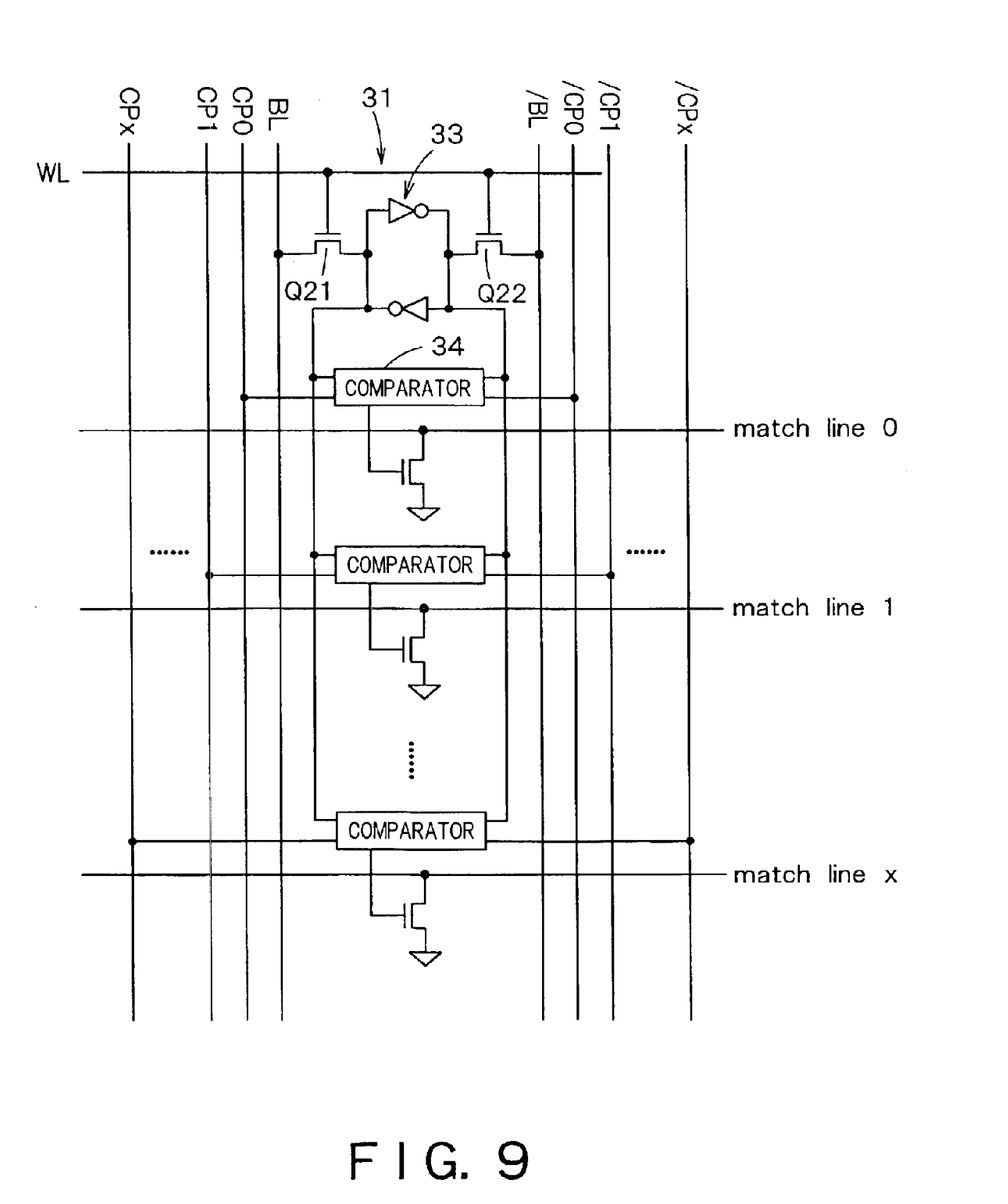
FIG. 9 is a circuit diagram of a conventional multi-comparison content addressable memory.

In a multi-comparison content addressable memory shown in FIG. 9 obtained by expanding the content addressable memory shown in FIG. 8, the number of wired-NORs increases and the problem of the current consumption is further aggravated. Even in a time-divisional multi-comparison CAM which performs multi-comparison in time division in order to restrain increase of layout, there is the problem in which current consumption increases.

SUMMARY OF THE INVENTION

A content addressable memory according to an embodiment of the present invention which detects whether p (where p is an integer of 2 or more) bit sequences coincide respectively with reference bit sequences, said content addressable memory comprising:

q comparison units which compares bit groups obtained by dividing the p bit sequences into q (where q is an integer of 2 or more) parts with corresponding bit groups in the reference bit sequences in p times;

a precharge unit which precharges output lines of said q comparison units; and a comparison control unit responsive to a decision of noncoincidence in at least one of said q comparison units while said q comparison units are conducting an $r_{th}$ (where r is an integer variable that is 1 or more and that is at most p−1, and p is an integer of 2 or more) comparison operation, which stops precharging to be performed by said precharge unit at time of an $(r+1)_{th}$ comparison operation and subsequent comparison operations.

Furthermore, a content addressable memory which detects whether p (where p is an integer of 2 or more) bit sequences coincide respectively with reference bit sequences, said content addressable memory comprising:

q comparison units which compares bit groups obtained by dividing the p bit sequences into q (where q is an integer of 2 or more) parts with corresponding bit groups in the reference bit sequences in p times; and a comparison control unit responsive to a decision of noncoincidence in at least one of said q comparison units while said q comparison units are conducting an $r_{th}$ (where r is an integer variable that is 1 or more and that is at most p−1, and p is an integer of 2 or more) comparison operation, which suspends an $(r+1)_{th}$ comparison operation and subsequent comparison operations to be conducted by said q comparison units.

DESCRIPTION OF THE PREFERRED EMBODIMENTS

Hereafter, a content addressable memory and a memory system according to the present invention will be described more specifically with reference to the drawings.

(First Embodiment)

Figure 1:
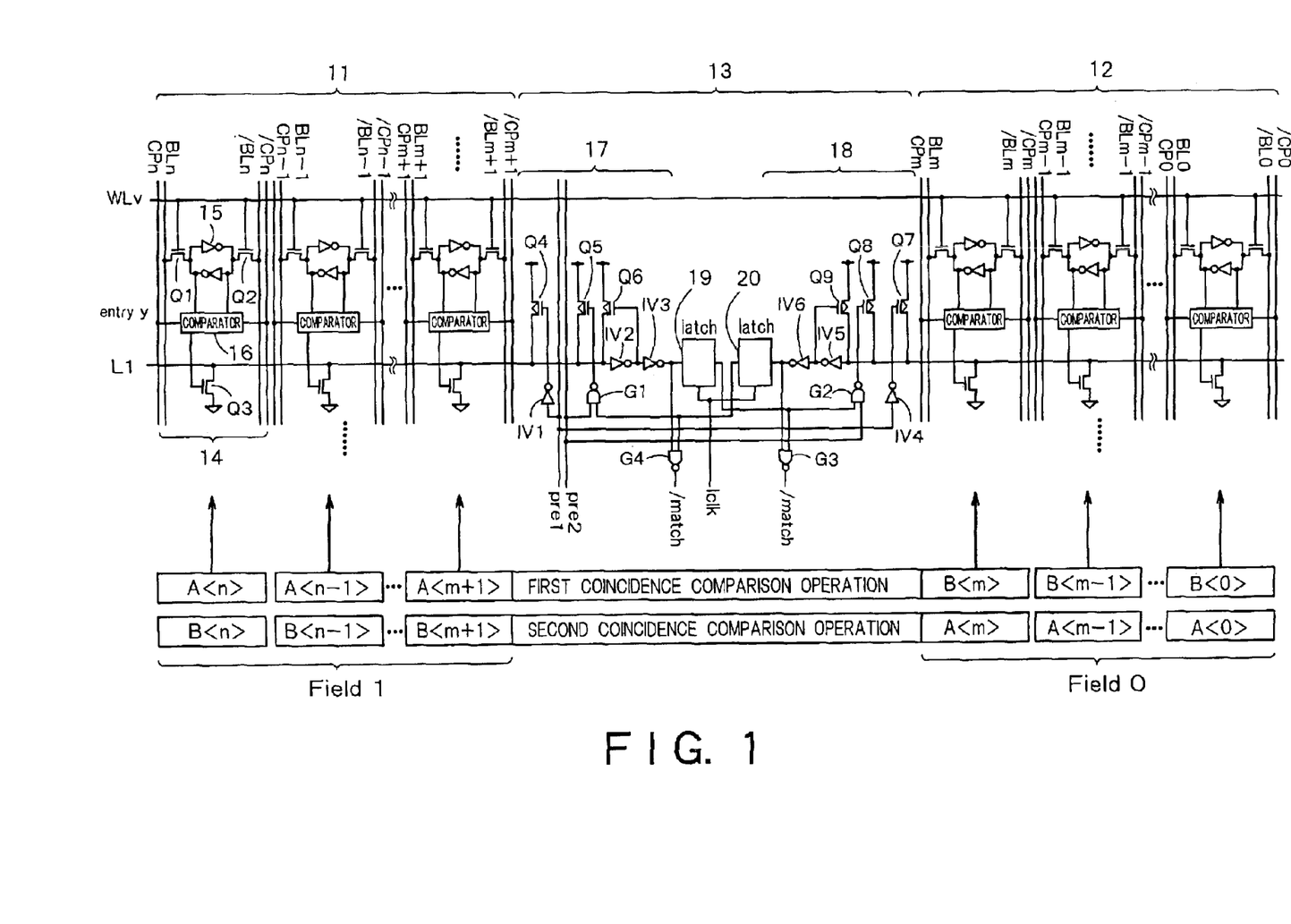
FIG. 1 is a circuit diagram showing an internal configuration of a first embodiment of a content addressable memory according to the present invention.
Figure 2:
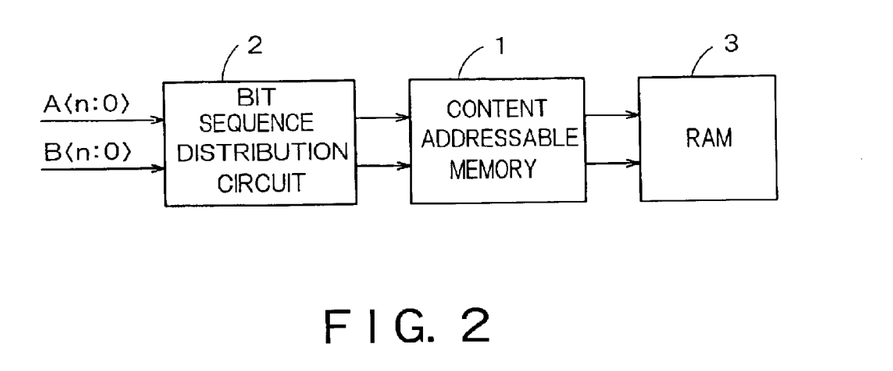
FIG. 2 is a block diagram showing a schematic configuration of a memory system including a content addressable memory 1 shown in FIG. 1.

FIG. 1 is a circuit diagram showing an internal configuration of a first embodiment of a content addressable memory according to the present invention. FIG. 2 is a block diagram showing the schematic configuration of a memory system including a content addressable memory 1 shown in FIG. 1.

The content addressable memory 1 of the present embodiment is a multi-comparison CAM which compares each of two bit sequences A<0:n> and B<0:n> with a reference bit sequence. More specifically, each of the bit sequences A<0:n> and B<0:n> is divided into a plurality of bit groups, and time is shifted for each group in order to perform comparison in twice. The content addressable memory 1 that performs such a comparison is called time division two-comparison CAM as well.

The content addressable memory 1 shown in FIG. 1 is supplied with bit groups from a bit sequence distribution circuit 2 shown in FIG. 2. The bit sequence distribution circuit 2 divides each of the bit sequences A<0:n> and B<0:n> into two bit groups, and supplies them to the content addressable memory 1. The number of bits need not necessarily be the same in respective bit groups.

The content addressable memory 1 shown in FIG. 1 performs comparison operation according to bit groups supplied from the bit sequence distribution circuit 2 shown in FIG. 2, and switches logics of coincidence lines according to results of comparison. A RAM 3 shown in FIG. 2 switches whether data should be outputted according to the logics of the coincidence lines.

Only the circuit configuration corresponding to one entry is shown in FIG. 1. However, the circuit shown in FIG. 1 may be provided for each of a plurality of entries. For each entry, the content addressable memory 1 shown in FIG. 1 includes two comparison circuits 11 and 12 and a comparison control circuit 13. The comparison circuits 11 and 12 compare the bit sequence supplied from the bit sequence distribution circuit 2 with a bit sequence stored in an SRAM cell 15 in twice.

The comparison circuit 11 includes bit comparison sections 14 corresponding to (n−m) bits. The comparison circuit 12 includes bit comparison sections 14 corresponding to (m+1) bits. In the same way as FIG. 8, each bit comparison section 14 includes an SRAM cell 15, transistors Q1 and Q2 which control reading/writing data from/into the SRAM cell 15, a comparator 16 which performs bit comparison, and a transistor Q3 controlled to turn on/off by an output of the comparator 16.

In respective bit comparison sections 14, drain terminals of the transistors Q3 are connected to a common output line L1.

The comparison control circuit 13 includes a precharge circuit 17 for the comparison circuit 11, a latch circuit 19 which controls precharge operation of the precharge circuit 17, a precharge circuit 18 for the comparison circuit 12, a latch circuit 20 which controls precharge operation of the precharge circuit 18, and NAND gates G3 and G4 which combine latch outputs of the latch circuits 19 and 20 and thereby generating the logics of the coincidence lines. The precharge circuit 17 includes transistors Q4 to Q6, a NAND gate G1, and inverters IV1 to IV3. The precharge circuit 18 includes transistors Q7 to Q9, a NAND gate G2, and inverters IV4 to IV6.

Figure 3:
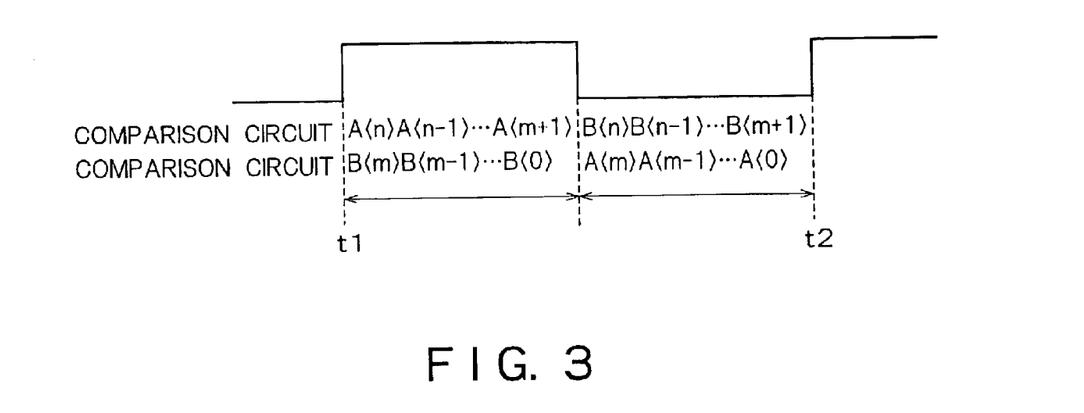
FIG. 3 is a timing diagram showing operation timing of a content addressable memory 1 shown in FIG. 1.

FIG. 3 is a timing diagram showing operation timing of the content addressable memory 1 shown in FIG. 1. As shown in FIG. 3, the content addressable memory 1 shown in FIG. 1 performs comparison operation in twice in a predetermined interval (for example, in one cycle of a processor ranging from t1 to t2). In a first comparison operation, the comparison circuit 11 performs comparison of A<n>A<n−1> . . . A<m+1>, and the comparison circuit 12 performs comparison of B<m>B<m−1> . . . B<0>. In a second comparison operation, the comparison circuit 11 performs comparison of B<n>B<n−1> . . . B<m+1>, and the comparison circuit 12 performs comparison of A<m>A<m−1> . . . A<0>.

Hereafter, it is supposed that the reference bit sequence is stored in the SRAM cells 15 in the bit comparison sections 14 beforehand. The reference bit sequence is written into the SRAM cells 15 by using bit lines BL and /BL.

First of all, both CP<n:0> and /CP<n:0> are set to their high level, and outputs of all comparators 16 in the two comparison circuits 11 and 12 are set to their low level. All Q3s are turned off.

Subsequently, a pulse of high level is supplied to a signal pre1 to precharge the output lines L1 of the two comparison circuits 11 and 12 to their high level.

Subsequently, a complementary signal for A<n:m+1> is inputted to CP<n:m+1> and /CP<n:m+1> for the comparison circuit 11. A complementary signal for B<m:0> is inputted to CP<m:0> and /CP<m:0> for the comparison circuit 12. As a result, comparison operation is performed in the bit comparison sections 14, and a result of the comparison is outputted to the output line L1. If noncoincidence occurs in at least one bit comparison section 14, then the output line L1 becomes the low level.

Current consumption required for operation heretofore described is the same as the operation current required for the conventional operation, i.e., the operation current required for the operation performed only once. The present embodiment has a feature that noncoincidence detected in any bit sequence in the first comparison operation prevents the second comparison operation from being performed for that bit sequence. As a result, the current consumption can be reduced.

The logics of the output lines L1 showing results of the first comparison operation are latched in the latch circuits 19 and 20. Unless noncoincidence occurs in any bit comparison section 14 in the comparison circuit 11, an output of the latch circuit 19 becomes its high level. If noncoincidence is detected in any one of the bit comparison sections 14, then the output of the latch circuit 19 becomes its low level.

If the output of the latch circuit 19 becomes its low level, then the transistor Q8 for precharging are not turned on, and the precharging is not performed.

The bit sequence distribution circuit 2 in the present embodiment supplies bit groups belonging to the same bit sequence to the comparison circuit 11 and the comparison circuit 12 respectively in the first comparison operation and the second comparison operation. For example, if noncoincidence is detected by the comparison circuit 11 in the first comparison operation, therefore, precharging for the comparison circuit 12 is not performed in the second comparison operation.

Thus in the present embodiment, if noncoincidence is detected in the comparison circuit 11 in the first comparison operation, precharging for the comparison circuit 12 is not performed in the second comparison operation. By contraries, if noncoincidence is detected by the comparison circuit 12 in the first comparison operation, precharging for the comparison circuit 11 is not performed in the second comparison operation.

Subsequently, the second comparison operation is started. First, CP<n:0> and /CP<n:0> are set to their high level. As a result, outputs of all comparators 16 become their low level, and all Q3 transistors are turned off.

Subsequently, a high level pulse is supplied to a signal pre2 to selectively precharge only comparison circuits in which noncoincidence has not been detected in the first comparison operation.

A complementary signal for B<n:m+1> is inputted to CP<n:m+1> and /CP<n:m+1> for the comparison circuit 11. A complementary signal for A<m:0> is inputted to CP<m:0> and /CP<m:0> for the comparison circuit 12.

In this state, the bit comparison sections 14 in the comparison circuits 11 and 12 perform comparison operations, and results of the comparison operations are outputted to the output lines L1.

The results of the first comparison operation are latched in the latch circuits 19 and 20. Therefore, the logics of the output lines L1, which indicate results of the second comparison operation, are combined with the latch outputs of the latch circuits 19 and 20 by using NAND gates G3 and G4. Coincidence signals are thus generated.

For example, if noncoincidence has been detected by neither the comparison circuit 11 nor the comparison circuit 12 in neither the first comparison operation nor the second comparison operation, then the logics of the coincidence lines /match become the low level. If noncoincidence has been detected by at least one of the comparison circuits 11 and 12, the logic of the coincidence line /match becomes the high level.

The RAM 3 shown in FIG. 2 outputs corresponding data if the coincidence line /match is its low level, whereas the RAM 3 does not output data if the coincidence line /match is its high level.

As a concrete implementation form of the present embodiment, a TLB (Translation Lookaside Buffer) which converts a virtual address to a physical address is conceivable. The virtual address inputted from the outside is subject to comparison in the content addressable memory 1. If the comparison result indicates coincidence, then the RAM 3 outputs a physical address corresponding to the virtual address.

The use object of the content addressable memory 1 of the present embodiment is not limited to the TLB.

In this way, in the first embodiment, each of data of two kinds A<n:0> and B<n:0> is divided into two parts to form bit groups. For each bit group, comparison processing is conducted in twice by using the two comparison circuits 11 and 12. If noncoincidence is detected in the first comparison operation, then the output line L1 is not precharged in the second comparison operation. As compared with the case where precharging is performed every time, therefore, the current consumption can be reduced up to 50%.

(Second Embodiment)

Figure 4:
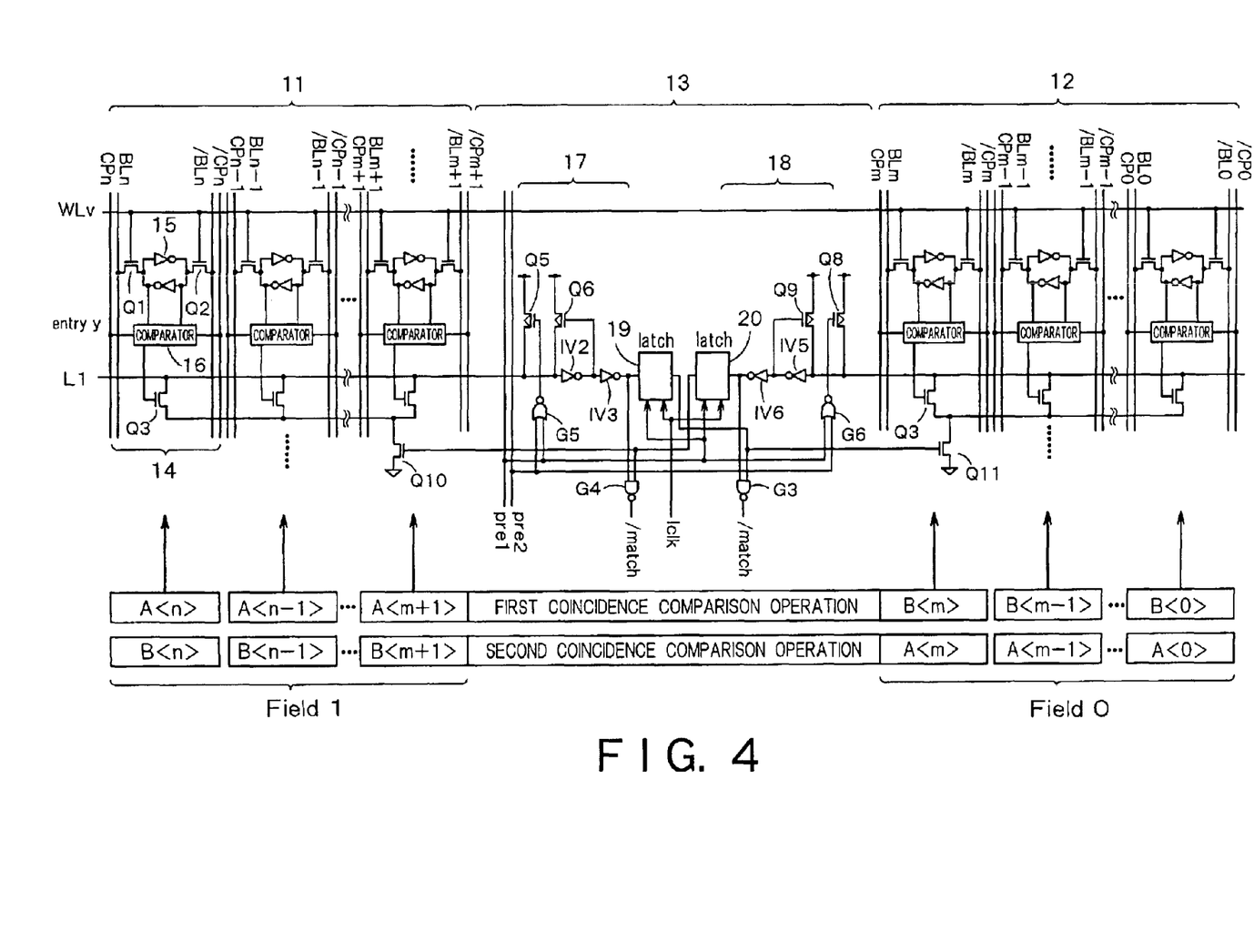
FIG. 4 is a circuit diagram showing an internal configuration of a second embodiment of a content addressable memory 1 according to the present invention.

In the second embodiment, noncoincidence detected in the first comparison operation stops the second comparison operation in the bit comparison sections 14.

FIG. 4 is a circuit diagram showing an internal configuration of the second embodiment of the content addressable memory 1 according to the present invention. In FIG. 4, components common to FIG. 1 are denoted by the same characters as in FIG. 1. Hereafter, the second embodiment will be described centered on differences between the first embodiment and the second embodiment.

Each of bit comparison sections 14 in the comparison circuits 11 and 12 includes transistors Q10 and Q11 which control whether source lines of transistors Q3 are cut off. The transistor Q10 is controlled to turn on or off by the latch output of the latch circuit 20. The transistor Q11 is controlled to turn on or off by the latch output of the latch circuit 19.

More specifically, if noncoincidence is detected by the comparison circuit 11, then the transistor Q11 is turned off and the transistor 3 in the comparison circuit 12 is also turned off. In the same way, if noncoincidence is detected by the comparison circuit 12, then the transistor Q10 is turned off, and the transistor Q3 also is turned off. This prevents a current from flowing from the bit comparison section 14 to the ground line. As a result, the comparison operation in the bit comparison section 14 can be suspended.

Hereafter, operation of the content addressable memory 1 shown in FIG. 4 will be described. First, both CP<n:0> and /CP<n:0> are set to their high level. As a result, all Q3 transistors, which are outputs of all bit comparison sections 14 in the comparison circuits 11 and 12, are turned off.

Subsequently, a pulse of high level is supplied to a signal pre1 to precharge the output lines L1 of the two comparison circuits 11 and 12 to their high level.

Subsequently, the latch circuits 19 and 20 which latch results of the first comparison operation performed by the comparison circuits 11 and 12 are set by the signal pre1 to make all bit comparison sections 14 in the comparison circuits 11 and 12 operable.

Subsequently, a complementary signal for A<n:m+1> is supplied to CP<n:m+1> and /CP<n:m+1> for the comparison circuit 11. A complementary signal for B<m:0> is inputted to CP<m:0> and /CP<m:0> for the comparison circuit 12.

As a result, the respective comparison sections 14 in the comparison circuits 11 and 12 perform comparison operations, and output results of the comparison operations to the output lines L1. The latch circuits 19 and 20 latch the logics of the output lines L1. The operation described heretofore is the same as that of the first embodiment.

If the output of the latch circuit 19 is the low level, then it is meant that noncoincidence has been detected in the comparison circuit 11. In this case, the transistor Q11 is turned off, and the transistor Q3 in the comparison circuit 12 is prevented from operating. Therefore, the current is prevented from flowing from the comparator 16 to the ground line, and the comparison circuit 12 does not perform the comparison operation. In addition, the logic of the coincidence line /match becomes the high level, and the RAM 3 is notified of noncoincidence.

On the other hand, if the outputs of the latch circuits 19 and 20 are high levels in the first comparison operation, then it is meant that noncoincidence has not been detected in the comparison circuits 11 and. 12. In this case, the transistors Q10 and Q11 are turned on, and the transistor Q3 can also operate. Therefore, second comparison operation is performed.

The second comparison operation itself is performed in a procedure similar to that of the first embodiment. First, both CP<n:0> and /CP<n:0> of the comparison circuits 11 and 12 are set to their high level. As a result, transistors Q3, which are outputs of all bit comparison sections 14 in the comparison circuits 11 and 12, are turned off.

Subsequently, a high level pulse is supplied to a signal pre2 to precharge the output lines L1 of the two comparison circuits 11 and 12. Subsequently, a complementary signal for B<n:m+1> is supplied to CP<n:m+1> and /CP<n:m+1> for the comparison circuit 11. A complementary signal for A<m:0> is supplied to CP<m:0> and /CP<m:0> for the comparison circuit 12.

The results of the first comparison operation are latched in the latch circuits 19 and 20. Therefore, the logics of the output lines L1, which indicate results of the second comparison operation, are combined with the latch outputs of the latch circuits 19 and 20 by using NAND gates G3 and G4. Coincidence signals are thus generated. For example, if noncoincidence has been detected by neither the comparison circuit 11 nor the comparison circuit 12 in neither the first comparison operation nor the second comparison operation, then the logics of the coincidence lines /match become the low level. If noncoincidence has been detected by at least one of the comparison circuits 11 and 12, the logic of the coincidence line /match becomes the high level.

Thus, in the second embodiment, noncoincidence detected in at least one of the comparison circuits when performing the first comparison operation turns the transistor Q10 or Q11 off and prevents the second comparison operation from being performed. As compared with the first embodiment, therefore, the current consumption can be suppressed and the current efficiency can be improved.

Since the two transistors Q3 and Q10 (or Q11) are connected in cascade in the current path in each comparison section 14, however, faster operation is possible in the first embodiment.

In the first and second embodiments, the example in which time division comparison is performed on the bit sequences of two kinds of A<n:0> and B<n:0> has been described. However, the present invention can also be applied to time division comparison on of three or more kinds of bit sequences.

Figure 5:
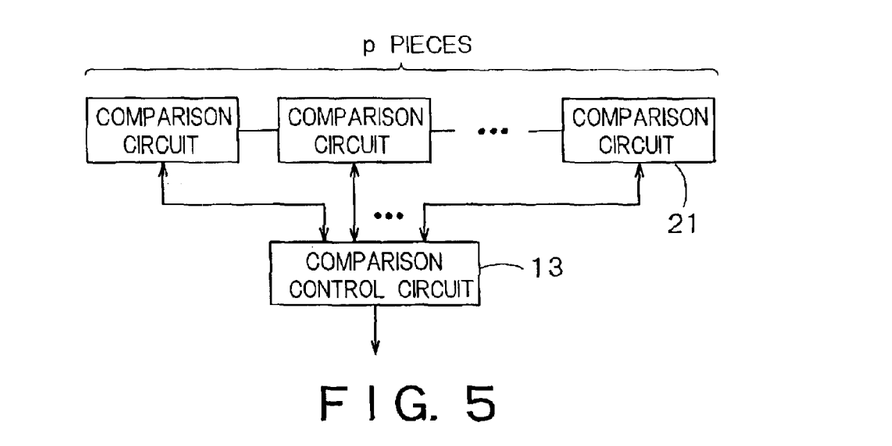
FIG. 5 is a block showing an example of a content addressable memory in which data is divided into three or more bit sequences and time division comparison is performed.

Hereafter, an example in which comparison is performed as to whether each of p (where p is an integer of 2 or more) bit sequences coincides with a reference bit sequence will be described. In this case, the content addressable memory 1 includes q (where q is an integer of 2 or more) comparison circuits 21 and a comparison control circuit 13, as shown in FIG. 5.

Each of q comparison circuits 21 compares each bit group obtained by dividing each of p bit sequences into q parts with a reference bit sequence in p times.

If noncoincidence is detected by at least one of comparison circuits 21 while q comparison circuits 21 are performing $r_{th}$ (where r is an integer variable that is 1 or more and at most p−1) comparison operation, the comparison control circuit 13 suspends $(r+1)_{th}$ and subsequent precharging, or suspends the comparison processing performed by the comparison circuits 21.

Figure 6:
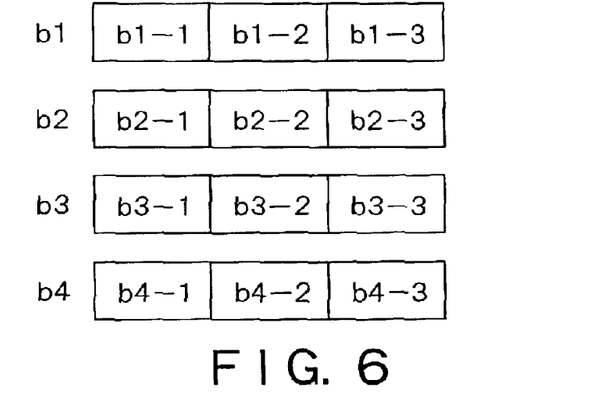
FIG. 6 is a diagram showing an example of bit sequences which are inputted to a content addressable memory shown in FIG. 5.

For example, it is now assumed that each of four bit sequences b1, b2, b3 and b4 is divided into three parts to form bit groups (b1-1, b1-2, b1-3), (b2-1, b2-2, b2-3), (b3-1, b3-2, b3-3), and (b4-1, b4-2, b4-3), as shown in FIG. 6 and comparison of these bit groups with reference bit sequences is performed in four times. In this case, comparison processing is performed in four times by using three comparison circuits 21.

Figure 7:
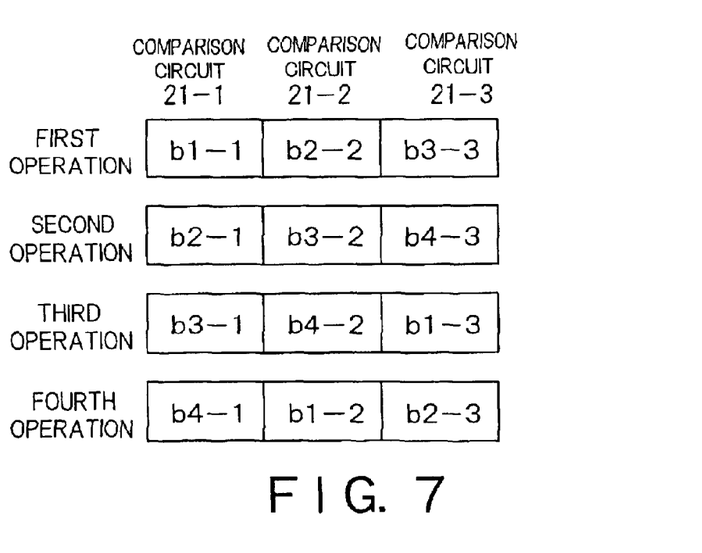
FIG. 7 is a diagram showing comparison operations performed in comparison circuits shown in FIG. 5.

First, as shown in FIG. 7, bit groups (b1-1, b2-2, b3-3) are inputted respectively to these three comparison circuits 21-1, 21-2 and 21-3, and a first comparison operation is performed. Subsequently, bit groups (b2-1, b3-2, b4-3) are inputted respectively to these comparison circuits 21-1, 21-2 and 21-3, and a second comparison operation is performed. Subsequently, bit groups (b3-1, b4-2, b1-3) are inputted respectively to these comparison circuits 21-1, 21-2 and 21-3, and a third comparison operation is performed. Subsequently, bit groups (b4-1, b1-2, b2-3) are inputted respectively to these comparison circuits 21-1, 21-2 and 21-3, and a fourth comparison operation is performed.

The comparison order of the bit groups is not necessarily restricted to that shown in FIG. 7. In short, respective comparison circuits need only to perform comparison on bit groups of different bit sequences each time.

Each of the reference bit sequence and p input bit sequences can be divided into q parts. However, the bit arrangement cannot be altered. Because the reference bit sequences to be compared therewith correspond thereto in one-to-one correspondence.

For example, as shown in FIG. 7, each of the comparison circuits 21-1, 21-2 and 21-3 performs comparison on the same bit groups of the bit sequences b1, b2, b3 and b4. For example, the comparison circuit 21-1 compares the bit groups b1-1, b2-1, b3-1 and b4-1 respectively with reference bit sequences. The comparison circuit 21-2 compares the bit groups b2-2, b3-2, b4-2 and b1-2 respectively with reference bit sequences. The comparison circuit 21-3 compares the bit groups b3-3, b4-3, b1-3 and b2-3 respectively with reference bit sequences.

What is claimed is:

1. A content addressable memory which detects whether p (where p is an integer of 2 or more) bit sequences coincide respectively with reference bit sequences, said content addressable memory comprising:

q comparison units which compare bit groups obtained by dividing the p bit sequences into q (where q is an integer of 2 or more) parts with corresponding bit groups in the reference bit sequences in p times;

a precharge unit which precharges output lines of said q comparison units; and a comparison control unit responsive to a decision of noncoincidence in at least one of said q comparison units while said q comparison units are conducting an rth (where r is an integer variable that is 1 or more and that is at most p−1, and p is an integer of 2 or more) comparison operation, which stops precharging to be performed by said precharge unit at time of an (r+1)th comparison operation and subsequent comparison operations, wherein said q comparison units compare bit groups in different bit sequences with corresponding bit groups in the reference bit sequences, respectively, in each of first to pth comparison operations.

2. A content addressable memory which detects whether p (where p is an integer of 2 or more) bit sequences coincide respectively with reference bit sequences, said content addressable memory comprising:

q comparison units which compare bit groups obtained by dividing the p bit sequences into q (where q is an integer of 2 or more) parts with corresponding bit groups in the reference bit sequences in p times;

a precharge unit which precharges output lines of said q comparison units; and a comparison control unit responsive to a decision of noncoincidence in at least one of said q comparison units while said q comparison units are conducting an rth (where r is an integer variable that is 1 or more and that is at most p−1, and p is an integer of 2 or more) comparison operation, which stops precharging to be performed by said precharge unit at time of an (r+1)th comparison operation and subsequent comparison operations, wherein the output lines of said q comparison units are connected in common, the output lines are precharged by said precharge unit, and if noncoincidence is detected by at least one of said comparison units, a current flows through a corresponding output line and a logic on the output line changes.

3. A content addressable memory which detects whether p (where p is an integer of 2 or more) bit sequences coincide respectively with reference bit sequences, said content addressable memory comprising:

q comparison units which compare bit groups obtained by dividing the p bit sequences into q (where q is an integer of 2 or more) parts with corresponding bit groups in the reference bit sequences in p times;

a precharge unit which precharges output lines of said q comparison units; and a comparison control unit responsive to a decision of noncoincidence in at least one of said q comparison units while said q comparison units are conducting an rth (where r is an integer variable that is 1 or more and that is at most p−1, and p is an integer of 2 or more) comparison operation, which stops precharging to be performed by said precharge unit at time of an (r+1)th comparison operation and subsequent comparison operations, said comparison control unit comprises:

q state holding units which are provided so as to respectively correspond to said q comparison units to hold comparison results of corresponding comparison units; and a combination unit which combines outputs of said q state holding units to output a final coincidence decision result.

4. The content addressable memory according to claim 3, wherein said q state holding units hold results of (p−1) comparison operations conducted by corresponding ones of said q comparison units, respectively.

5. The content addressable memory according to claim 3, wherein said q precharge unit precharges the output lines of said q comparison units before said q comparison units start, respectively, in each of the first to pth comparison operations.

6. A content addressable memory which detects whether p (where p is an integer of 2 or more) bit sequences coincide respectively with reference bit sequences, said content addressable memory comprising:

q comparison units which compares bit groups obtained by dividing the p bit sequences into q (where q is an integer of 2 or more) parts with corresponding bit groups in the reference bit sequences in p times; and a comparison control unit responsive to a decision of noncoincidence in at least one of said q comparison units while said q comparison units are conducting an rth (where r is an integer variable that is 1 or more and that is at most p−1, and p is an integer of 2 or more) comparison operation, which suspends an (r+1)th comparison operation and subsequent comparison operations to be conducted by said q comparison units.

7. The content addressable memory according to claim 6, comprising:

q discharge units which are provided so as to respectively correspond to said q comparison units to discharge corresponding output lines of said q comparison units respectively, wherein said q discharge units perform switching to determine whether corresponding output lines of said q comparison units should be discharged, and if a decision of noncoincidence is made in any one of comparison units, corresponding one of said discharge units suspends a discharge operation on a basis of the output of said comparison control unit.

8. The content addressable memory according to claim 7, wherein said q discharge units respectively precharge output lines of said q comparison units before said q comparison units start each of first to pth comparison operations.

9. The content addressable memory according to claim 6, wherein said q comparison units compare bit groups in different bit sequences with corresponding bit groups in said reference bit sequences in each of the first to pth comparison operations.

10. The content addressable memory according to claim 6, wherein said comparison control unit comprises:

q state holding units which are provided so as to respectively correspond to said q comparison units to hold comparison results of said corresponding comparison units respectively; and a combination unit which combines outputs of said q state holding units to output a final coincidence decision result.

11. The content addressable memory according to claim 10, wherein said q state holding units hold results of (p−1) comparison operations conducted by corresponding ones of said q comparison units, respectively.

12. A memory system comprising:

a content addressable memory which detects whether p (where p is an integer of 2 or more) bit sequences coincide respectively with reference bit sequences, and outputting a detection result signal;

a RAM (Random Access Memory) which switches whether stored data is to be outputted on the basis of the detection result signal; and a bit sequence distribution unit which supplies bit groups obtained by dividing the p bit sequences into q (where q is an integer of 2 or more) parts to said content addressable memory in p times, wherein said content addressable memory comprises:

q comparison units which compares bit groups supplied from said bit sequence distribution unit thereto in p times with corresponding bit groups in the reference bit sequences;

a precharge unit which precharges output lines of said q comparison units; and a comparison control unit responsive to a decision of noncoincidence in at least one of said q comparison units while said q comparison units are conducting an rth (where r is an integer variable that is 1 or more and that is at most p−1, and p is an integer of 2 or more) comparison operation, which stops precharging to be performed by said precharge unit.

13. The memory system according to claim 12, wherein said q comparison units compare bit groups in different bit sequences with corresponding bit groups in the reference bit sequences, respectively, in each of first to pth comparison operations.

14. The memory system according to claim 12, wherein the output lines of said q comparison units are connected in common, the output lines are precharged by said precharge unit, and if noncoincidence is detected by at least one of said comparison units, a current flows through a corresponding output line and a logic on the output line changes.

15. The memory system according to claim 12, wherein said comparison control unit comprises:

q state holding units which are provided so as to respectively correspond to said q comparison units to hold comparison results of corresponding comparison units respectively; and a combination unit which combines outputs of said q state holding units to output a final coincidence decision result.

16. A memory system comprising:

a content addressable memory which detects whether p (where p is an integer of 2 or more) bit sequences coincide respectively with reference bit sequences, and outputting a detection result signal;

a RAM (Random Access Memory) which switches whether stored data is to be outputted on the basis of the detection result signal; and a bit sequence distribution unit which supplies bit groups obtained by dividing the p bit sequences into q (where q is an integer of 2 or more) parts to said content addressable memory in p times, wherein said content addressable memory comprises:

q comparison units which compare bit groups supplied from said bit sequence distribution unit thereto in p times with corresponding bit groups in the reference bit sequences; and a comparison control unit responsive to a decision of noncoincidence in at least one of said q comparison units while said q comparison units are conducting an rth (where r is an integer variable that is 1 or more and that is at most p−1, and p is an integer of 2 or more) comparison operation, which suspends an (r+1)th comparison operation and subsequent comparison operations to be conducted by said q comparison units.

17. The memory system according to claim 16, comprising:

q discharge units which are provided so as to respectively correspond to said q comparison units to discharge corresponding output lines of said q comparison units respectively, wherein said q discharge units perform switching to determine whether corresponding output lines of said q comparison units should be discharged, and if a decision of noncoincidence is made in any one of comparison units, corresponding one of said discharge units suspends a discharge operation on a basis of the output of said comparison control unit.

18. The memory system according to claim 16, wherein said q comparison units compare bit groups in different bit sequences with corresponding bit groups in the reference bit sequences, respectively, in each of first to pth comparison operations.

19. The memory system according to claim 16, wherein said comparison control unit comprises:

q state holding units which are provided so as to respectively correspond to said q comparison units to hold comparison results of corresponding comparison units respectively; and a combination unit which combines outputs of said q state holding units to output a final coincidence decision result.

20. A content addressable memory which detects whether p (where p is an integer of 2 or more) bit sequences coincide respectively with reference bit sequences, said content addressable memory comprising:

q comparison units which compare bit groups obtained by dividing the p bit sequences into q (where q is an integer of 2 or more) parts with corresponding bit groups in the reference bit sequences in p times;

q precharge units provided corresponding to said q comparison units, respectively, each switching whether or not to precharge output lines in either of the other comparison units based on comparison result of the corresponding comparison unit; and a comparison control unit responsive to a decision of noncoincidence in at least one of said q comparison units while said q comparison units are conducting an rth (where r is an integer variable that is 1 or more and that is at most p−1, and p is an integer of 2 or more) comparison operation, which stops precharging to be performed by said precharge unit at time of an (r+1)th comparison operation and subsequent comparison operations.

* * * * *